US012113081B2

(12) United States Patent
Yan et al.

(10) Patent No.: US 12,113,081 B2
(45) Date of Patent: Oct. 8, 2024

(54) PACKAGE STRUCTURE HAVING PACKAGED LIGHT DETECTING COMPONENTS WITHIN AND PACKAGE METHOD THEREOF

(71) Applicant: Taiwan RedEye Biomedical Inc., Hsinchu (TW)

(72) Inventors: Shuo-Ting Yan, Hsinchu (TW); Chen-Chung Chang, Hsinchu (TW); Tsung-Jui Lin, Hsinchu (TW)

(73) Assignee: TAIWAN REDEYE BIOMEDICAL INC., Hsinchu (TW)

( * ) Notice: Subject to any disclaimer, the term of this patent is extended or adjusted under 35 U.S.C. 154(b) by 405 days.

(21) Appl. No.: 17/541,821

(22) Filed: Dec. 3, 2021

(65) Prior Publication Data

US 2023/0178573 A1 Jun. 8, 2023

(51) Int. Cl.
*H01L 27/14* (2006.01)
*H01L 25/04* (2023.01)
*H01L 27/146* (2006.01)

(52) U.S. Cl.
CPC ...... *H01L 27/14621* (2013.01); *H01L 25/042* (2013.01); *H01L 27/14618* (2013.01); *H01L 27/14685* (2013.01)

(58) Field of Classification Search
CPC ......... H01L 27/14621; H01L 27/14623; H01L 27/14625; H01L 27/14627; H01L 25/042; H01L 27/14618; H01L 27/1462; H01L 27/14685
USPC ....................................................... 257/434
See application file for complete search history.

(56) References Cited

U.S. PATENT DOCUMENTS

| 9,448,114 B2 | 9/2016 | Goldring et al. |
| 2007/0092179 A1* | 4/2007 | Park ............... G02B 26/0808 385/14 |
| 2011/0180893 A1 | 7/2011 | Minegishi et al. |
| 2014/0168576 A1* | 6/2014 | Lee ............... G02F 1/133603 349/71 |
| 2014/0353788 A1* | 12/2014 | Jin ............... H01L 31/02005 257/434 |
| 2018/0175114 A1* | 6/2018 | Lee ............... H04N 25/133 |

(Continued)

FOREIGN PATENT DOCUMENTS

| CN | 112556844 A | 3/2021 |
| TW | 201807838 A | 3/2018 |

(Continued)

*Primary Examiner* — Didarul A Mazumder
(74) *Attorney, Agent, or Firm* — RABIN & BERDO, P.C.

(57) ABSTRACT

The package structure having packaged components within includes a circuit board, multiple packaged light detecting components mounted on the circuit board, a sealing cap being light transmittable, multiple light filtering films mounted on the sealing cap, and a supporting annular wall. The two opposite ends of the supporting annular wall are adhesively bonded to the surfaces of the circuit board and the sealing cap, such that the projection on the circuit board of the light filtering films corresponds the packaged light detecting components. Since the light filtering films have different filtering frequency bands, each packaged light detecting component detects light of different frequency bands in one incident light beam. The package method is simple and stable, effectively lowering the manufacture cost of the light detecting module.

10 Claims, 10 Drawing Sheets

(56) References Cited

U.S. PATENT DOCUMENTS

| | | |
|---|---|---|
| 2019/0137332 A1 | 5/2019 | Chu et al. |
| 2020/0089056 A1* | 3/2020 | Watanabe ......... G02F 1/133605 |
| 2020/0089057 A1* | 3/2020 | Watanabe ............ G02B 6/0073 |
| 2020/0111768 A1* | 4/2020 | Last ...................... G01S 7/4813 |
| 2020/0227600 A1* | 7/2020 | Watanabe ......... G02F 1/133603 |
| 2020/0249530 A1* | 8/2020 | He .................... G02F 1/133609 |

FOREIGN PATENT DOCUMENTS

| | | |
|---|---|---|
| TW | 201813117 A | 4/2018 |
| TW | 202119001 A | 5/2021 |
| WO | 2005013369 A1 | 2/2005 |

\* cited by examiner

PACKAGE STRUCTURE HAVING PACKAGED LIGHT DETECTING COMPONENTS WITHIN AND PACKAGE METHOD THEREOF

BACKGROUND OF THE INVENTION

1. Field of the Invention

The present invention relates to a package structure and a package method, particularly to a package structure with packaged components and a package method thereof.

2. Description of the Related Art

Spectroscope detecting technology detects light of different frequencies in one single beam. A spectroscope may be an all-frequency spectroscope or partial-frequency spectroscope. An all-frequency spectroscope usually utilizes optical grating or prism to separate light of different frequencies in one beam to measure the light of each frequency separately. On the other hand, a popular solution for partial-frequency spectroscope is to mount different band-pass filters on light detecting components, such that each light detecting component receives light of different frequency bands for measurement.

Photosensitive die is a popular choice for light detecting components, in which a few photosensitive dies are packaged in one package to form a light detecting module. A light receiving surface of each photosensitive die is coated with a light filtering film, such that each photosensitive die receives band light of different frequencies in an incident light beam. Therefore, each photosensitive die generates a light detecting signal corresponding to a specific frequency band of light, and the light detecting module can measure different frequency bands of light in the incident light beam.

However, since the light filtering film is coated directly on the photosensitive die, if there is any defect formed in the photosensitive film during the coating process that causes the photosensitive film to fail, the photosensitive die with the defected light filtering film must be discarded, even though the photosensitive die itself is fine. The manufacture cost of the light detecting module is therefore elevated because of such situation. In conclusion, the manufacture method of the circuit board needs to be improved.

SUMMARY OF THE INVENTION

An objective of the present invention is to provide a package structure having packaged components within and a package method, the package structure includes a circuit board, multiple packaged light detecting components, a supporting annular wall, a sealing cap, and multiple light filtering films. The circuit board has a mounting surface. The packaged light detecting components are mounted on the mounting surface of the circuit board. The supporting annular wall has a first end and a second end. The first end is mounted on the mounting surface of the circuit board and surrounds the packaged light detecting components. The sealing cap is light transmittable, and has a first surface and a second surface. The first surface is adhesively bonded to the second end of the supporting annular wall. The light filtering films are mounted on the second surface of the sealing cap, and a projection of each light filtering film on the mounting surface of the circuit board corresponds to a respective one of the packaged light detecting components.

Another objective of the present invention is to provide a package method, including the following steps:

preparing a circuit board and multiple packaged light detecting components;

mounting the packaged light detecting components on a mounting surface of the circuit board to connect the packaged light detecting components to a circuit layer of the circuit board;

preparing a sealing cap; wherein the sealing cap is light transmittable, and has a first surface and a second surface;

preparing multiple light filtering films;

mounting the light filtering films onto the first surface of the sealing cap;

preparing a supporting annular wall having two opposite ends, and adhesively bonding one of the ends of the supporting annular wall to the mounting surface of the circuit board;

adhesively bonding the first surface of the sealing cap to the other end of the supporting annular wall, such that the projection of each light filtering film on the mounting surface of the circuit board corresponds to a respective one of the packaged light detecting components.

The package method is performed to manufacture the package structure of the present invention. Packaged light detecting components are arranged on the circuit board to detect incident light beams that ought to be measured after specific filtering. The incident light beams are filtered by the light filtering films on the sealing cap. The sealing cap is fixed upon the mounting surface of the circuit board by the supporting annular wall, such that the projection positions of the light filtering films correspond to the packaged light detecting components. Therefore, an incident light beam that enters from the second surface of the sealing cap will be filtered by the light filtering films before entering the corresponding packaged light detecting components. The circuit board, the supporting annular wall, and the sealing cap form an intact package structure. The present invention utilizes packaged light detecting components, and mounts the light filtering films on the sealing cap. Any defect during the coating process of the filtering films does not interfere with the light detecting components, and the situation of fine light detecting components being discarded because of light filtering film defect is avoided. As a result, the manufacture cost of the packaged structure with packaged components is lowered.

DETAILED DESCRIPTION OF THE INVENTION

Figure 1:
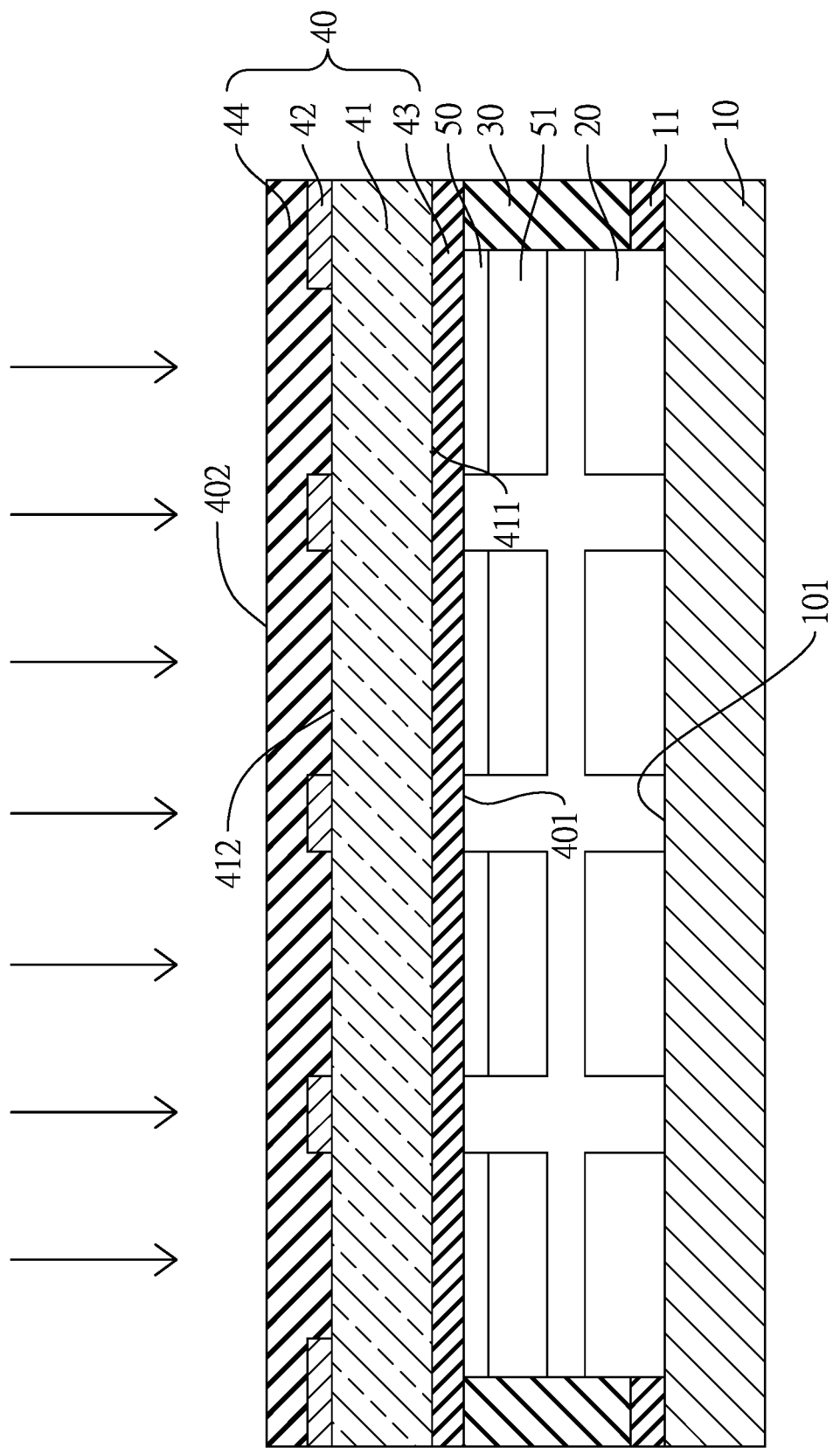
FIG. 1 is a cross-sectional view of a first embodiment of a package structure having packaged components within of the present invention.
Figure 2:
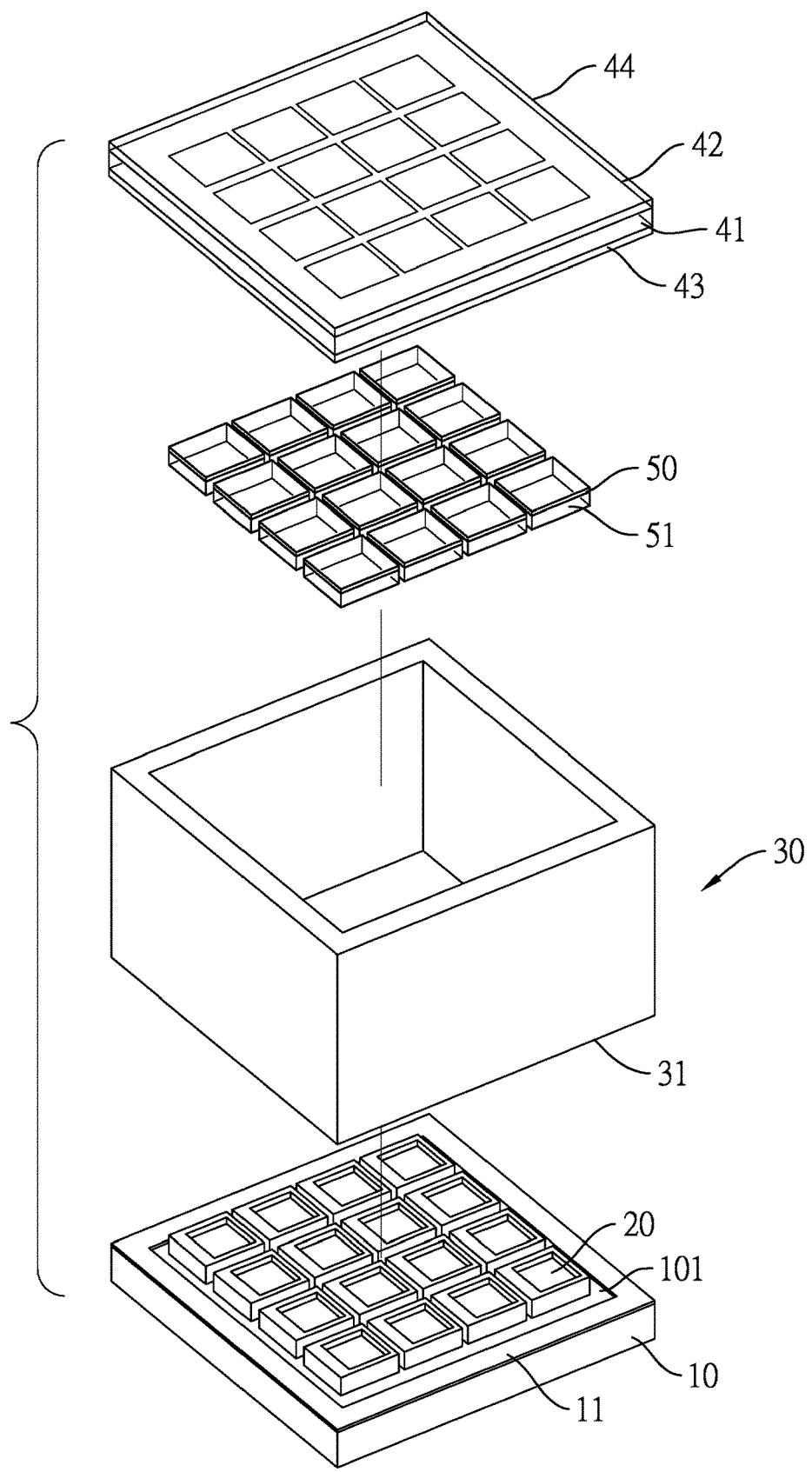
FIG. 2 is a cross-sectional view of the package structure having packaged components within of the present invention.

With reference to FIG. 1 and FIG. 2, the package structure having packaged components within of the present invention includes a circuit board 10, multiple packaged light detecting components 20, an annular supporting wall 30, a sealing cap 40 and multiple light filtering films 50. The sealing cap 40 is light transmittable. The circuit board 10 has a mounting surface 101, and the packaged light detecting components 20 are mounted on the mounting surface 101 of the circuit board 10. The supporting annular wall 30 has a first end 31 and an opposite second end 32, and the first end 31 is mounted on the mounting surface 101 of the circuit board 10 and surrounds the packaged light detecting components 20. An end of the supporting annular wall 30 is adhesively bonded to the mounting surface 101 of the circuit board by an adhesive layer 11 on the mounting surface 101. The adhesive layer 11 has an annular contour that corresponds to the end of the supporting annular wall 30.

The sealing cap 40 has a first surface 401 and an opposite second surface 402, and the first surface 401 is adhesively bonded to the second end 32 of the supporting annular wall 30. The light filtering films 50 are mounted on the first surface 401 of the sealing cap 40. Preferably, the filtering frequency bands of the light filtering films 50 are different from each other. The light filtering films 50 are arranged on the sealing cap 40 according to the arranged position of the light packaged light detecting components 20 on the circuit board 10.

In an embodiment, the sealing cap 40 includes a light transmittable substrate 41, a patterned shading layer 42, an anti-reflection layer 44, and an adhesive layer 43. The light transmittable substrate 41 has a lower surface 411 and an upper surface 412. The patterned shading layer 42 is mounted on the upper surface 412 of the light transmittable substrate 41, and the projection pattern of the patterned shading layer 42 on the circuit board 10 corresponds to the gap between the packaged light detecting components 20. Together with reference to FIG. 2, for example, the packaged light detecting components 20 are arranged in a matrix, and the patterned shading layer 42 has a grid pattern. Each light transmittable square part of the patterned shading layer 42 corresponds to a packaged light detecting component 20, and therefore the incident light beam that passes through the patterned shading layer 42 can precisely enter each light filtering film 50 and enter each packaged light detecting component 20, avoiding redundant light scattering in the packaged structure.

Preferably, an anti-reflection layer 44 is mounted on the upper surface 412 of the light transmittable substrate 41 and covers the patterned shading layer 42. The anti-reflection layer 44 lowers the reflection rate of the incident light beam. The adhesive layer 43 is mounted on the lower surface 411 of the light transmittable substrate 41. In the present embodiment, the surface of the adhesive layer 43 is the first surface 401 of the sealing cap 40, which adhesively bonds to the second end 32 of the supporting annular wall 30 and the light filtering film 50. Preferably, the adhesive layer 43 is a highly light transmittable or transparent, and is adhesive on both surfaces.

With reference to FIG. 1, in a first embodiment of the present invention, each light filtering film 50 is mounted on the surface of a substrate unit 51. The light filtering films 50 are mounted on the first surface 401 of the sealing cap 40 with the substrate units 51. Preferably, the substrate units 51 are transparent glass substrates.

With reference to FIG. 2, in an embodiment, the packaged light detecting components 20 are mounted on the mounting surface 101 of the circuit board 10 by welding, and preferably arranged in a matrix. Correspondingly, the light filtering films 50 are arranged in a matrix such that the projection of the light filtering films 50 on the circuit board 10 corresponds to the packaged light detecting components 20. To be more specific, a projection of each light filtering film 50 covers a packaged light detecting component 20.

Figure 3:
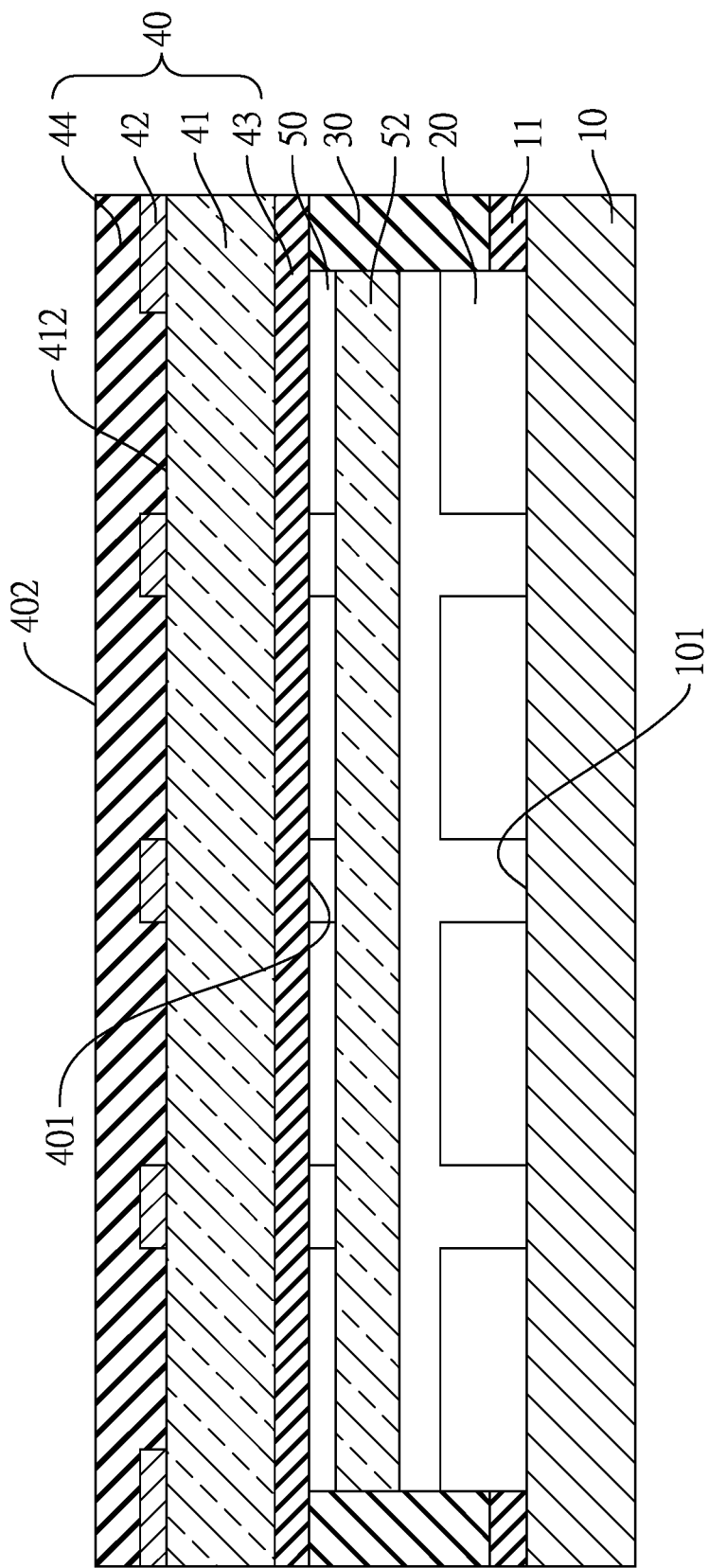
FIG. 3 is a cross-sectional view of a second embodiment of the package structure having packaged components within of the present invention.

With reference to FIG. 3, in a second embodiment, the light filtering films 50 are mounted on one co-substrate 52. The co-substrate 52 is adhesively bonded to the first surface 401 of the sealing cap 40, such that the light filtering films 50 are mounted on the first surface 401 of the sealing cap 40. Preferably, the co-substrate 52 is a transparent glass substrate.

Figure 4:
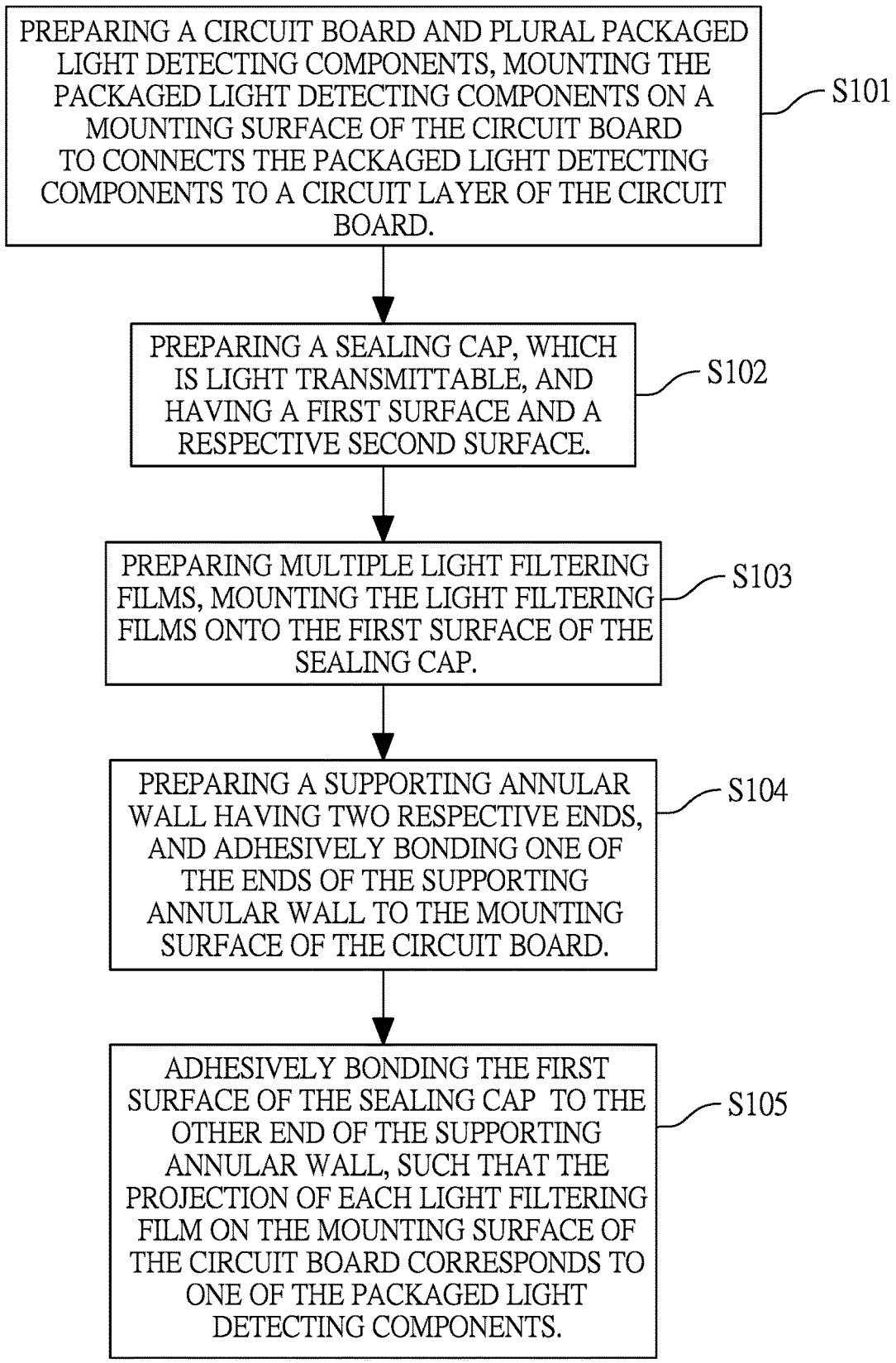
FIG. 4 is a flow chart of a package method of the present invention.

With reference to FIG. 4, the package method includes the following steps S101-S105.

S101: preparing a circuit board 10 and multiple packaged light detecting components 20, and mounting the packaged light detecting components 20 on a mounting surface 101 of the circuit board 10 to connect the packaged light detecting components 20 to a circuit layer of the circuit board 10;

S102: preparing a sealing cap 40; wherein the sealing cap is light transmittable, and has a first surface 401 and an opposite second surface 402;

S103: preparing multiple light filtering films 50, mounting the light filtering films 50 onto the first surface 401 of the sealing cap 40; preferably, the filtering frequency band of each light filtering film 50 is different from each other;

S104: preparing a supporting annular wall 30 having two opposite ends, and adhesively bonding one of the ends of the supporting annular wall 30 to the mounting surface 101 of the circuit board 10;

S105: adhesively bonding the first surface 401 of the sealing cap 40 to the other end of the supporting annular wall 30, such that the projection of each light filtering film 50 on the mounting surface 101 of the circuit board 10 corresponds to a respective one of the packaged light detecting components 20.

The detailed description for the package method is provided as follows.

Figure 5A:
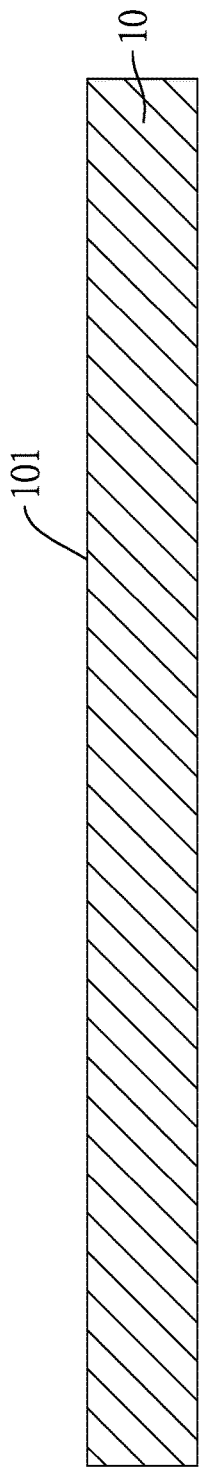
FIGS. 5A to 5C are cross-sectional views of the preparation process of the circuit board and packaged light detecting components of the present invention.
Figure 5B:
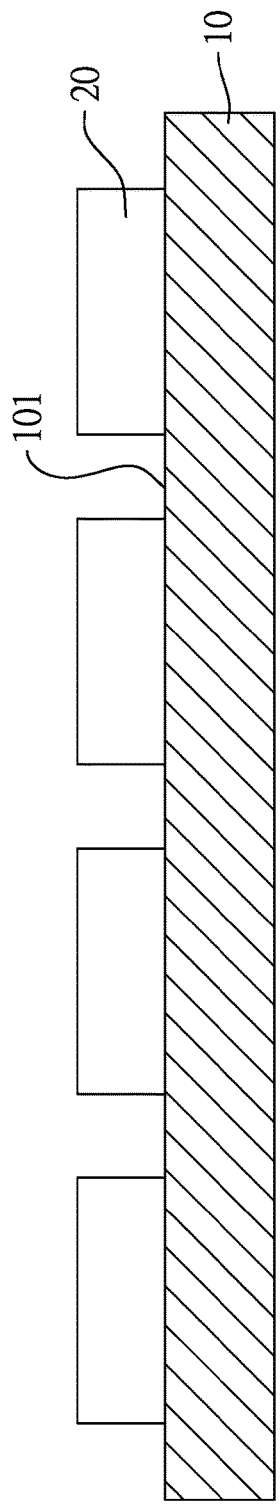

Please refer to FIG. 5A to FIG. 5B for step S101. With reference to FIG. 5A, firstly, prepare the circuit board 10. The circuit board 10 includes a connecting circuit layer and multiple surface connecting pads on the mounting surface 101 for connecting the packaged light detecting components 20. With reference to FIG. 5B, then mount the packaged light detecting components 20 onto the mounting surface 101 and connect the packaged light detecting components 20 to the connecting circuit layer through the surface connecting pad.

Figure 5C:
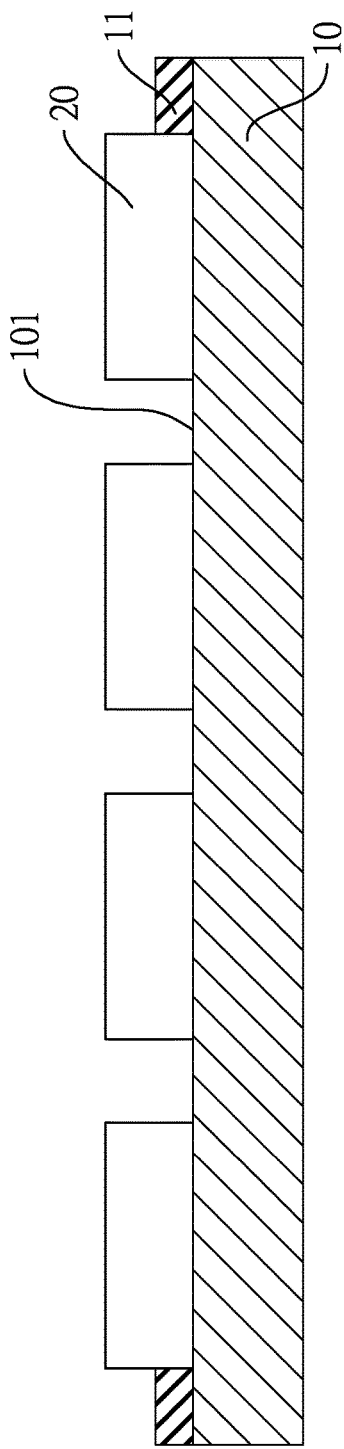

With reference to FIG. 5C, in an embodiment, the adhesive layer 11 is then mounted on the mounting surface 101 of the circuit board 10 for the bonding of the supporting annular wall 30.

Figure 6A:
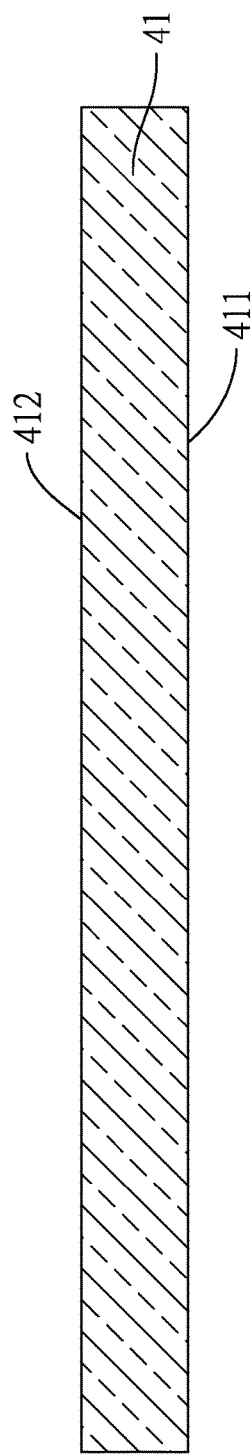
FIGS. 6A to 6D are cross-sectional views of the preparation process of the sealing cap of the present invention.
Figure 6B:
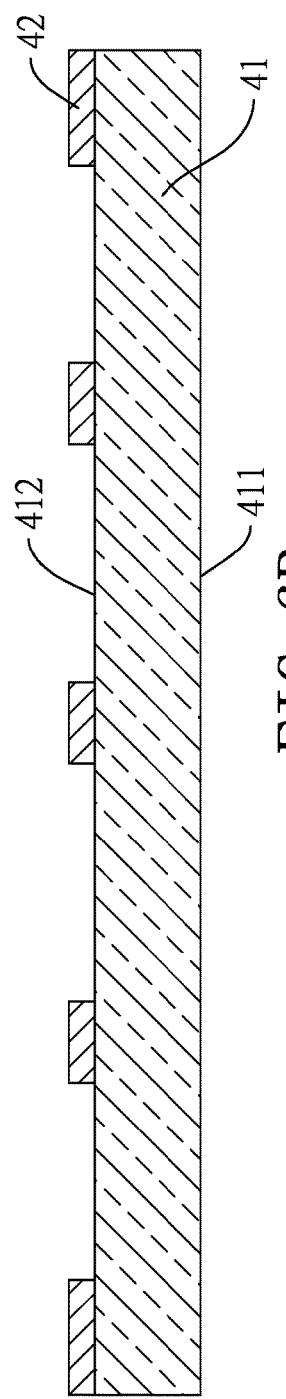
Figure 6C:
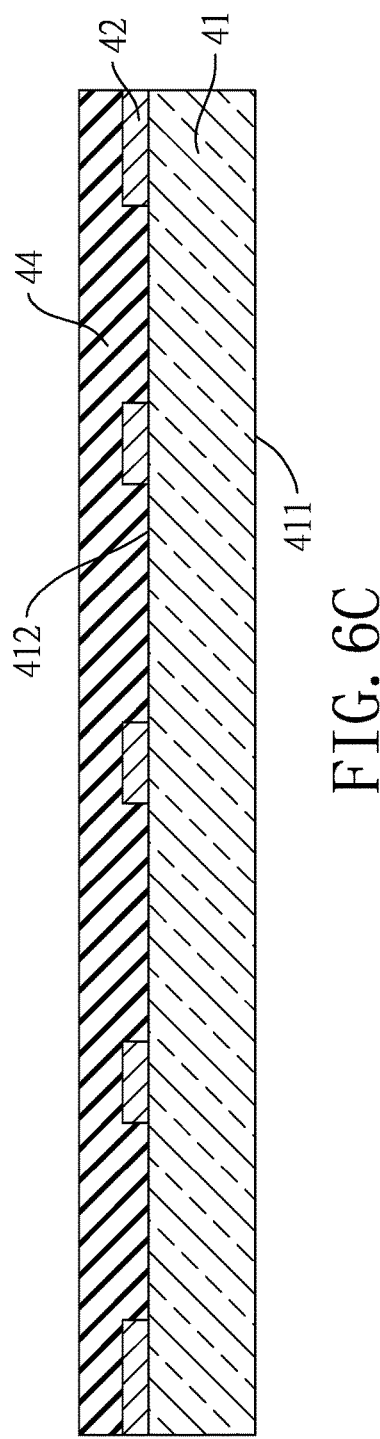
Figure 6D:
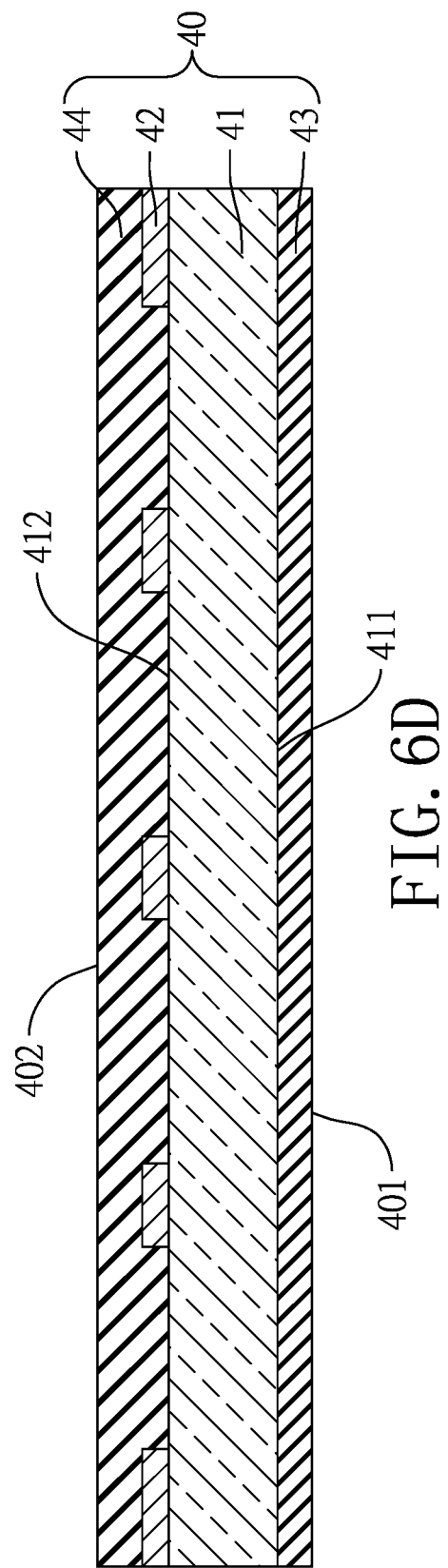

Please refer to FIG. 6A to FIG. 6D for step S102. With reference to FIG. 6A, provide the light transmittable substrate 41 having the lower surface 411 and the upper surface 412. With reference to FIG. 6B, mount the patterned shading layer 42 on the upper surface 412 of the light transmittable substrate 41. With reference to FIG. 6C, further mount the patterned shading layer 42 on the upper surface 412 of the light transmittable substrate 41. With reference to FIG. 6D, mount the adhesive layer 43 on the lower surface 411 of the light transmittable substrate 41. In the present embodiment, the surface of the adhesive layer 43 is the first surface 401 of the sealing cap 40.

Figure 8:
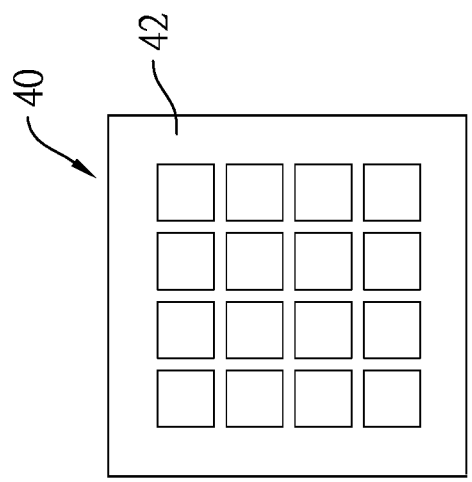
FIG. 8 is a top view of the sealing cap of the present invention.
Figure 7:
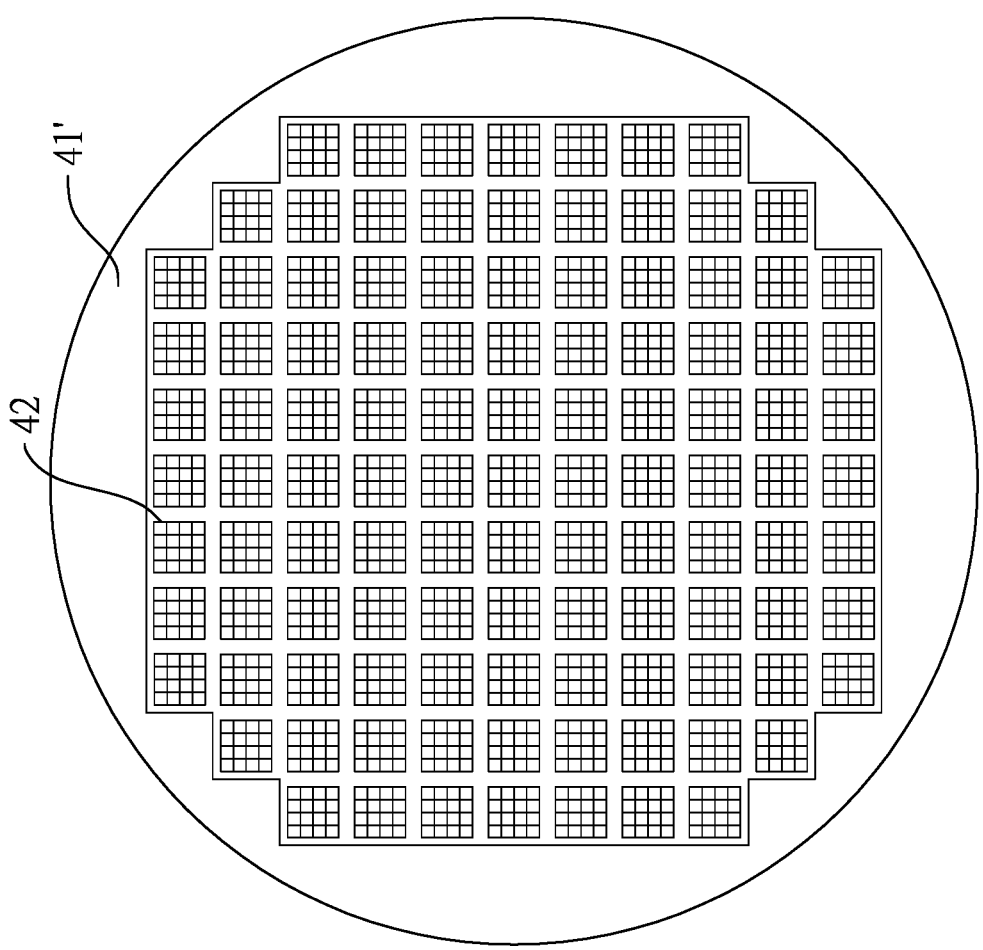
FIG. 7 is a top view of the preparation process of the sealing cap of the present invention.

With reference to FIG. 7, in a preferred embodiment, the step of mounting the patterned shading layer 42 on the upper surface 412 of the light transmittable surface is performed on a raw light transmittable substrate 41. Preferably, the raw light transmittable substrate 41 is a large piece of round glass, which can go through a photolithography process to form multiple patterned shading layers 42 on the raw light transmittable substrate 41. With reference to FIG. 8, a cutting process is performed to the raw light transmittable substrate 41 to separate each area with patterned shading layer 42 and form multiple units of light transmittable substrate 41, which is the base of the sealing cap 40 with the light transmittable substrate 41 and the patterned shading layer 42. Such photolithography process and cutting process can be performed with conventional semiconductor manufacture machines. There is no need for any new or specialized machine for these particular processes, and therefore the manufacture cost is further lowered.

In the first embodiment as shown in FIG. 1, each light filtering film 50 is mounted on a surface of the substrate unit 51 and then adhesively bonded to the first surface 401 of the sealing cap 40.

Figure 9A:
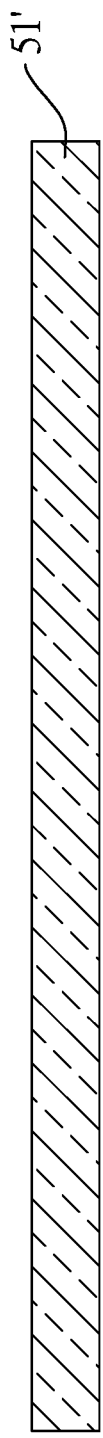
FIGS. 9A to 9C are cross-sectional views of the preparation process of the light filtering films of the first embodiment of the present invention.
Figure 9B:
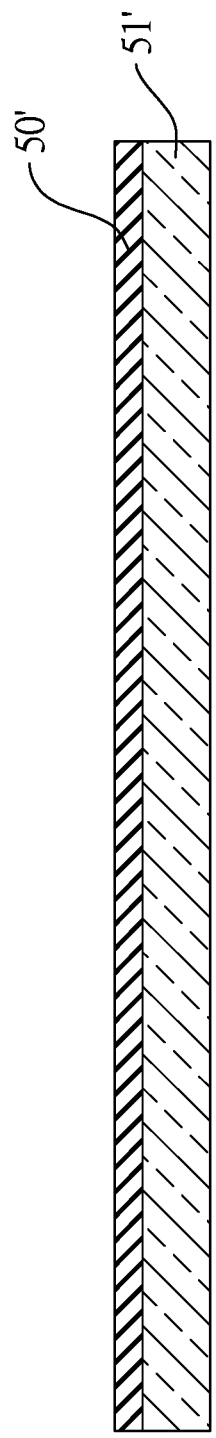
Figure 9C:
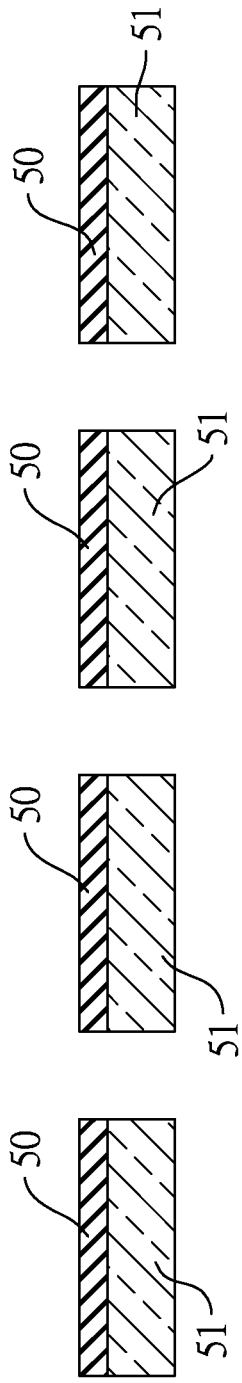
Figure 10A:
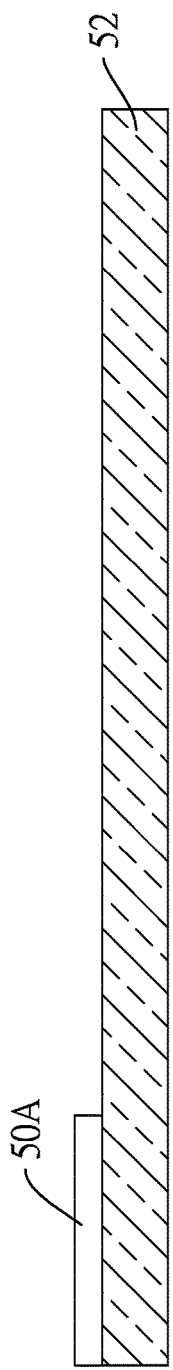
FIGS. 10A to 10D are cross-sectional views of the preparation process of the light filtering films of the first embodiment of the present invention.
Figure 10B:
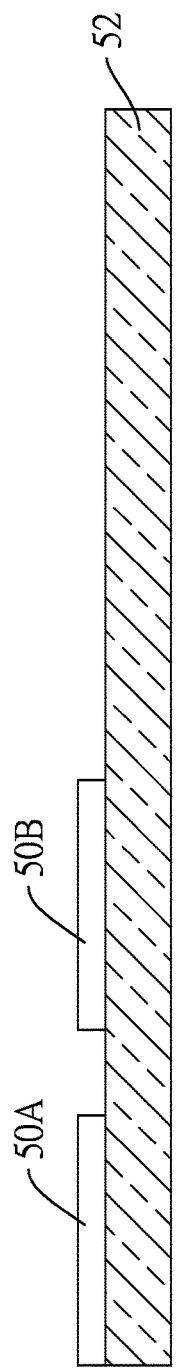
Figure 10C:
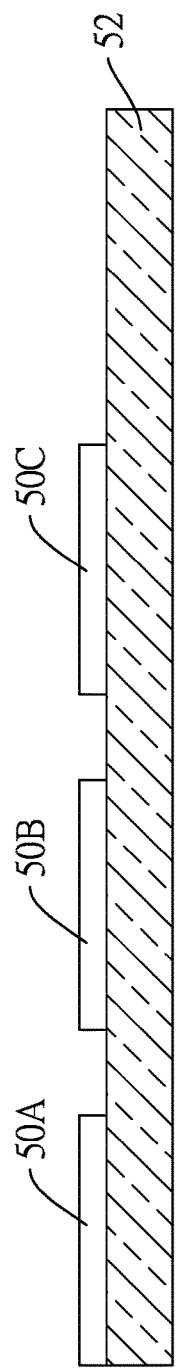
Figure 10D:
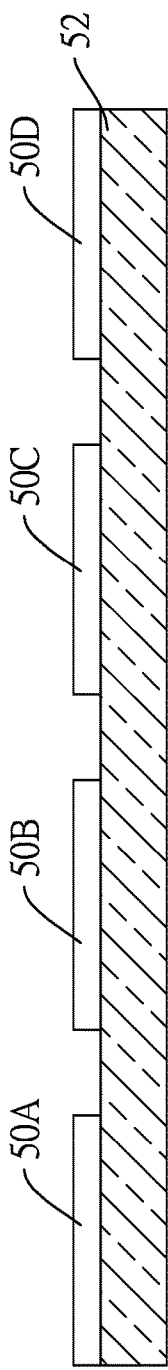

Please refer to FIG. 9A to FIG. 9C for step S103 of the first embodiment. With reference to FIG. 9A, firstly, prepare a raw substrate. With reference to FIG. 9B, perform a coating process on the raw substrate to mount a raw light filtering film 50 on the surface. With reference to FIG. 9C, perform a cutting process to the raw substrate and the raw light filtering film 50, and form multiple substrate units 51 with the light filtering film 50 on the surface. To prepare multiple light filtering films 50 with different light filtering frequency bands, the steps showed in FIG. 9A to FIG. 9C have to be performed multiple times, wherein the coating process is done with coating materials having different filtering frequency bands, to prepare light filtering films 50 for different filtering frequency bands. The step of mounting the light filtering films 50 on the sealing cap 40 is to adhesively bond the substrate units 51 after the coating process to the first surface 401 of the sealing cap 40 and the arranged position of the substrate units 51 corresponds to the arranged position of the packaged light detecting units on the circuit board 10.

In the second embodiment as shown in FIG. 2, the light filtering films 50 are mounted on a co-substrate 52 by patterned coating processes. The co-substrate 52 is then adhesively bonded to the first surface 401 of the sealing cap 40, such that the light filtering films 50 are mounted on the first surface 401 of the sealing cap 40.

Please refer to FIG. 10A-FIG. 10D for S103 of the second embodiment. The coating process is performed for multiple times on the co-substrate 52 to mount light filtering films 50A, 50B, 50C, 50D with different filtering frequencies. The arranged position of the light filtering films 50A, 50B, 50C, 50D corresponds to the arranged position of the packaged light detecting units on the circuit board 10. After the coating processes of the light filtering films 50, the co-substrate 52 is adhesively bonded to the first surface 401 of the sealing cap 40.

After the steps of mounting the packaged light detecting components 20 on the circuit board 10, and the steps of preparing the sealing cap 40 and the light filtering films 50, steps S104 and S105 combine the components and the supporting annular wall 30 to complete the package structure.

With reference to FIG. 2, the first end 31 and the second end 32 of the supporting annular wall 30 are adhesively bonded to the adhesive layer 11 on the mounting surface 101 of the circuit board 10 and the adhesive layer 43 on the first surface 401 of the sealing cap 40. The package light detecting components and the light filtering films 50 are therefore accommodated in the accommodation space formed between the circuit board 10, the supporting annular wall 30, and the sealing cap 40, and the projections on the circuit board 10 of the light filtering films 50 correspond to the package light detecting components. When incident light beam enters from the second surface 402 of the sealing cap 40, it passes through the light filtering films 50 and enters the corresponding packaged light detecting components 20, achieving the goal of detecting multiple frequency bands with packaged light detecting components 20 of the same specification in one package structure.

In an embodiment, the accommodation space is filled with encapsulation material for fixing and protecting the package structure.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A package structure having packaged light detecting components within, comprising:
   a circuit board having a mounting surface;
   multiple packaged light detecting components mounted on the mounting surface of the circuit board;
   a supporting annular wall having a first end and an opposite second end, wherein the first end is mounted on the mounting surface of the circuit board and surrounds the multiple packaged light detecting components;
   a sealing cap being light transmittable and having a first surface and an opposite second surface, wherein the first surface is adhesively bonded to the second end of the supporting annular wall;
   multiple light filtering films mounted on the second surface of the sealing cap;
   wherein a projection of each light filtering film on the mounting surface of the circuit board corresponds to a respective one of the multiple packaged light detecting components;
   wherein the sealing cap includes a patterned shading layer;
   wherein a projection pattern of the patterned shading layer on the circuit board corresponds to a gap between the multiple packaged light detecting components;
   wherein the patterned shading layer of the sealing cap has a grid pattern; and wherein light transmittable square parts of the patterned shading layer each correspond to a respective one of the multiple packaged light detecting components.

2. The package structure as claimed in claim 1, wherein filtering frequency bands of the multiple light filtering films are different from each other; and
the multiple packaged light detecting components are arranged in a matrix.

3. The package structure as claimed in claim 1, wherein the sealing cap comprises a light transmittable substrate having an upper surface and a lower surface;
wherein the patterned shading layer is mounted on the upper surface of the light transmittable substrate.

4. The package structure as claimed in claim 3, wherein the sealing cap further comprises:
an anti-reflection layer mounted on the upper surface of the light transmittable substrate;
an adhesive layer mounted on the lower surface of the light transmittable substrate;
wherein a surface of the adhesive layer is the first surface of the sealing cap.

5. The package structure as claimed in claim 1, further comprising:
multiple substrate units;
wherein the multiple light filtering films are each respectively mounted on a surface of each of the multiple substrate units, and the multiple substrate units are adhesively bonded to the first surface of the sealing cap such that the multiple light filtering films are mounted on the first surface of the sealing cap.

6. The package structure as claimed in claim 1, further comprising:
a co-substrate;
wherein the multiple light filtering films are mounted on the co-substrate, and the co-substrate is adhesively bonded to the first surface of the sealing cap such that the multiple light filtering films are mounted on the first surface of the sealing cap.

7. A package method, comprising steps of:
preparing a circuit board and multiple packaged light detecting components;
mounting the multiple packaged light detecting components on a mounting surface of the circuit board to connect the multiple packaged light detecting components to a circuit layer of the circuit board;
preparing a sealing cap;
wherein the sealing cap is light transmittable and has a first surface and an opposite second surface;
preparing multiple light filtering films;
mounting the multiple light filtering films onto the first surface of the sealing cap;
preparing a supporting annular wall having two opposite ends, and adhesively bonding one of the ends of the supporting annular wall to the mounting surface of the circuit board;
adhesively bonding the first surface of the sealing cap to the other end of the supporting annular wall, such that the projection of each light filtering film on the mounting surface of the circuit board corresponds to a respective one of the multiple packaged light detecting components;
wherein the sealing cap includes a patterned shading layer;

wherein a projection pattern of the patterned shading layer on the circuit board corresponds to a gap between the multiple packaged light detecting components;
wherein the patterned shading layer of the sealing cap has a grid pattern; and
wherein light transmittable square parts of the patterned shading layer each correspond to a respective one of the multiple packaged light detecting components.

8. The package method as claimed in claim 7, wherein the step of preparing the sealing cap further comprises sub-steps of:
providing a light transmittable substrate having an upper surface and a lower surface;
mounting the patterned shading layer on the upper surface of the light transmittable substrate;
mounting an adhesive layer on the lower surface of the light transmittable substrate, wherein a surface of the adhesive layer is the first surface of the sealing cap;
when the first surface of the sealing cap is adhesively bonded to the other end of the supporting annular wall, the projection pattern of the patterned shading layer on the mounting surface of the circuit board corresponds to a gap between the multiple packaged light detecting components; and
mounting an anti-reflection layer on the upper surface of the light transmittable substrate such that the anti-reflection layer covers the patterned shading layer.

9. The package method as claimed in claim 7, wherein the step of preparing the multiple light filtering films further comprises sub-steps of:
preparing a raw substrate;
performing a coating process on a surface of the raw substrate to mount a raw light filtering film on a surface of the raw substrate;
performing a cutting process to the raw substrate and the raw light filtering film, and forming multiple substrate units with the light filtering film on the surface;
repeating the sub-steps with coating materials of different light filtering frequency bands multiple times;
wherein the step of mounting the multiple light filtering films onto the first surface of the sealing cap is to adhesively bond the multiple substrate units with the multiple light filtering films of different light filtering frequency bands to the first surface of the sealing cap, and a position of the multiple substrate units corresponds to a position of the multiple packaged light detecting components on the circuit board.

10. The package method as claimed in claim 7, wherein the step of preparing the multiple light filtering films further comprises sub-steps of:
preparing a co-substrate;
performing a coating process multiple times on a surface of the co-substrate to mount the multiple light filtering films on the surface of the co-substrate;
wherein the step of mounting the multiple light filtering films onto the first surface of the sealing cap is to adhesively bond the co-substrate after the coating process to the first surface of the sealing cap, and a position of the multiple light filtering films corresponds to a position of the multiple packaged light detecting components on the circuit board;
wherein light filtering frequency bands of the multiple light filtering films are different from each other.

* * * * *